(12) United States Patent
Tsukuda

(10) Patent No.: US 6,282,414 B1
(45) Date of Patent: Aug. 28, 2001

(54) WIRELESS SELECTIVE CALL RECEIVING APPARATUS WHICH CAN REDUCE CURRENT CONSUMPTION AND WIRELESS SELECTIVE CALL RECEIVING METHOD

(75) Inventor: Naoki Tsukuda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/198,180

(22) Filed: Nov. 23, 1998

(30) Foreign Application Priority Data

Dec. 3, 1997 (JP) ..................................................... 9/350052

(51) Int. Cl.[7] ............................... H04B 1/26; H04B 1/16; H04B 7/00; H03L 1/00; H04L 27/22
(52) U.S. Cl. ......................... 455/326; 455/254; 455/343; 455/323; 455/334; 331/176; 375/334
(58) Field of Search ..................................... 455/326, 318, 455/323, 334, 313, 260, 343, 254, 311, 226.1, 232.1, 234.1, 245.1, 250.1, 324; 375/202, 334, 343

(56) References Cited

U.S. PATENT DOCUMENTS

| | | | |
|---|---|---|---|
| 5,091,921 | * | 2/1992 | Minami ................................. 375/334 |
| 5,239,683 | * | 8/1993 | Usui ..................................... 455/254 |
| 5,382,922 | * | 1/1995 | Gersbach et al. ..................... 331/1 A |
| 5,757,244 | * | 5/1998 | Nonaka et al. ....................... 331/176 |
| 6,014,571 | * | 1/2000 | Enoki ............................... 455/314 X |
| 6,026,288 | * | 2/2000 | Bronner ................................ 455/343 |
| 6,084,905 | * | 7/2000 | Ishifuji et al. ....................... 375/202 |

FOREIGN PATENT DOCUMENTS

| | | |
|---|---|---|
| 2 315 894 A | 2/1998 | (GB) . |
| 63-90316 | 6/1988 | (JP) . |
| 4-215323 | 8/1992 | (JP) . |

\* cited by examiner

*Primary Examiner*—Tracy LeGree
(74) *Attorney, Agent, or Firm*—Scully, Scott, Murphy & Presser

(57) ABSTRACT

A wireless selective call receiving apparatus includes a mixer section, a detecting section and a control section. The mixer section converts a frequency of a received signal. The detecting section detects a carrier frequency when the received signal is received. The control section controls a current sent to the mixer section based on a result detected by the detecting section.

22 Claims, 5 Drawing Sheets

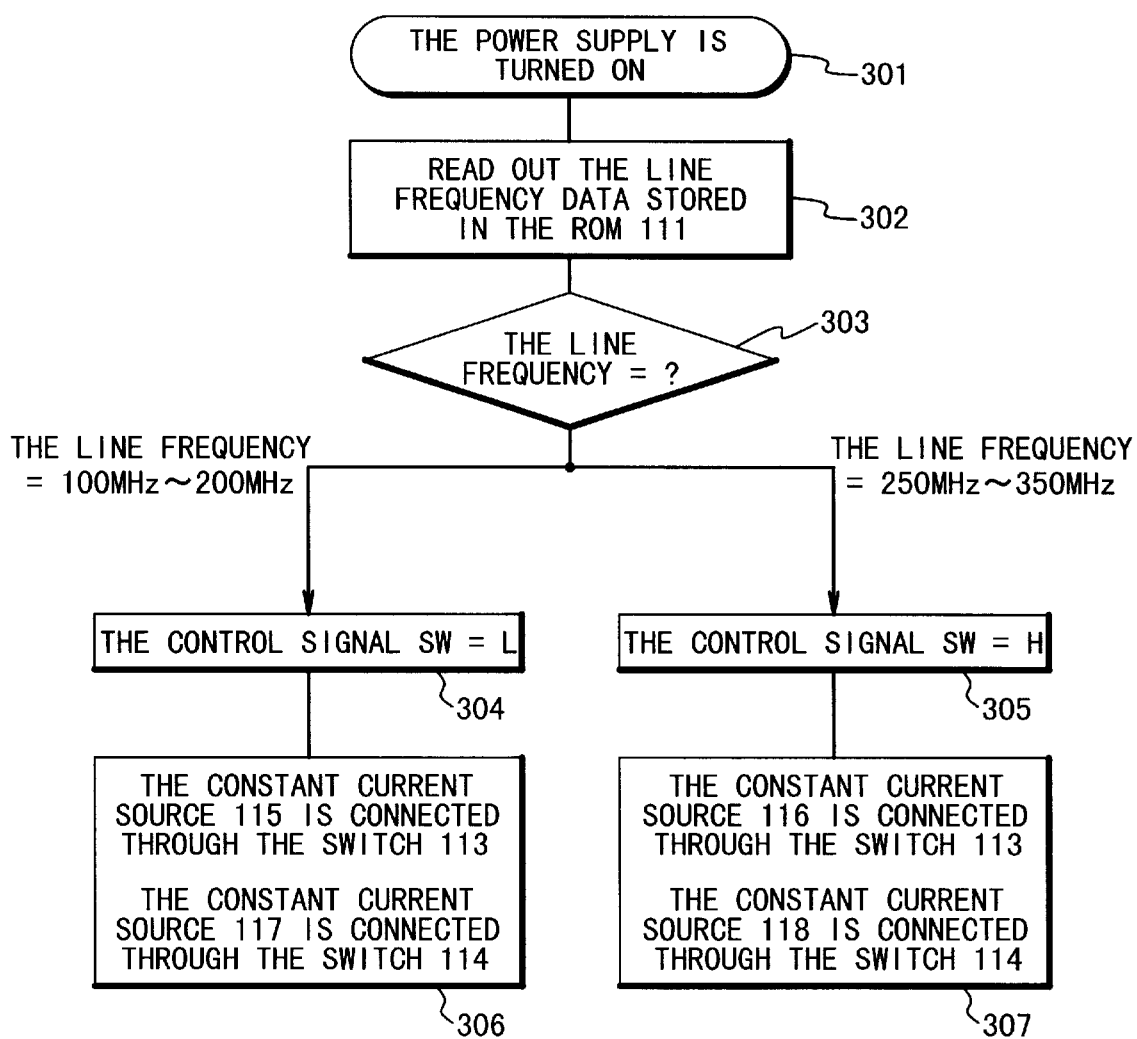

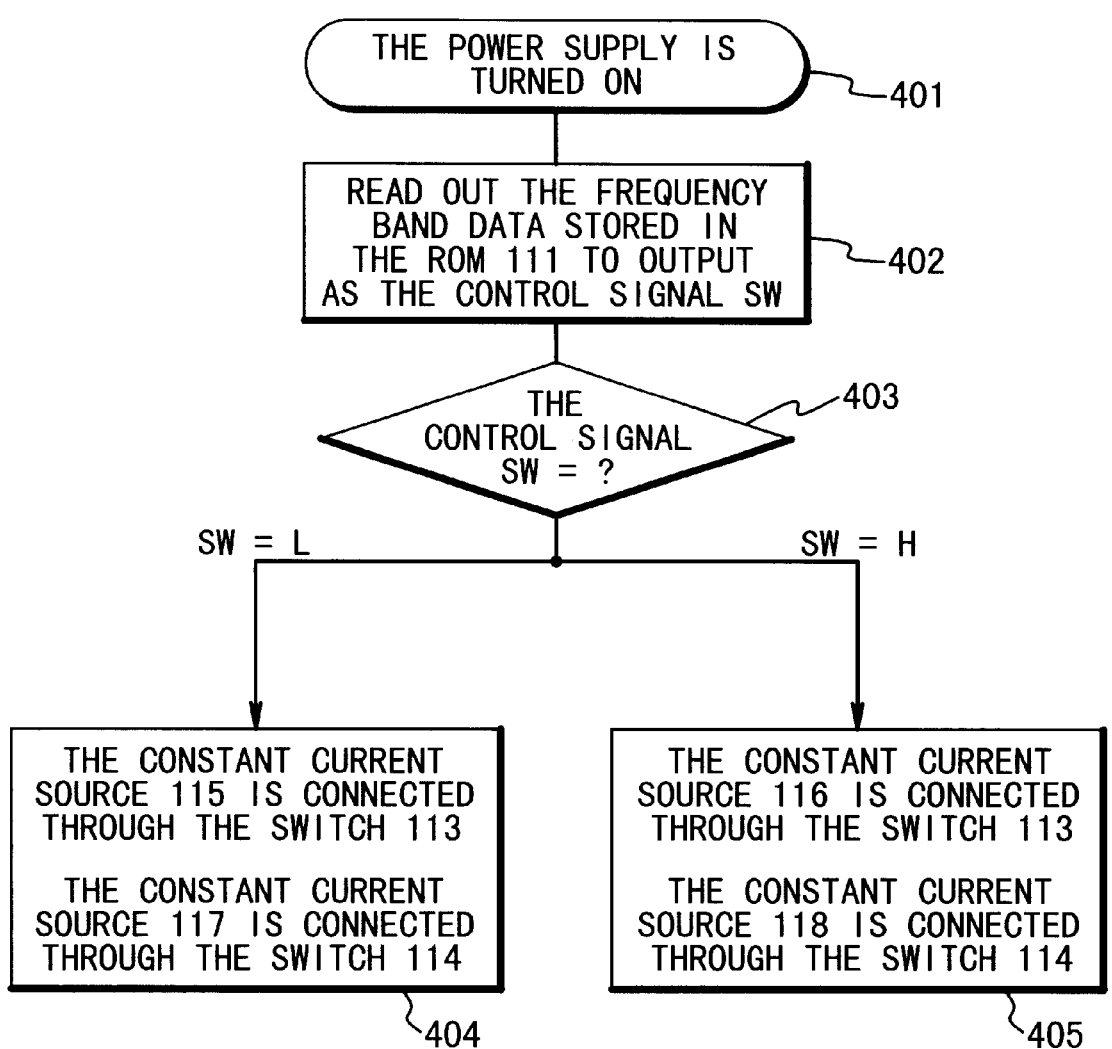

WIRELESS SELECTIVE CALL RECEIVING APPARATUS WHICH CAN REDUCE CURRENT CONSUMPTION AND WIRELESS SELECTIVE CALL RECEIVING METHOD

BACKGROUND OF THE INVENTION

1. Field of the Invention

The present invention relates to a wireless selective call receiving apparatus and a wireless selective call receiving method. More particularly, the present invention relates to a direct conversion type of a wireless selective call receiving apparatus and a wireless selective call receiving method to optimally control an operation current of mixers based on a carrier frequency from carrier frequency information stored in a memory.

2. Description of the Related Art

A conventional paging receiver includes a locally oscillating circuit, a mixing circuit and a band pass filter. The mixing circuit mixes a constant frequency signal generated from the locally oscillating circuit with a received signal. The band pass filter is provided in a subsequent stage of the mixing circuit. A frequency band of a signal to be passed through the band pass filter is fixed and narrow. In the paging receiver, only a received signal is demodulated which has a predetermined frequency difference with the frequency signal outputted by the locally oscillating circuit.

In the paging system, a transmission frequency is slightly changed every paging service area to avoid a cross talk among service areas adjacent to each other. For the reason, a paging receiver must have a locally oscillating circuit to output a transmission frequency signal used in a paging area in which the paging receiver is used.

Therefore, many types corresponding to respective transmission frequencies must be manufactured, which cause the manufacturing management to be complex and also causes the drop of the manufacturing cost to be impeded.

In a method disclosed in Japanese Laid Open Patent Application (JP-A-Heisei 4-215323), a PLL synthesizer 15 is used as a locally oscillating circuit of a receiving section. And a frequency division number N of a programmable frequency divider 20 for determining an oscillation frequency of the PLL synthesizer 15 is set based on information corresponding to a frequency signal to be received stored in an ROM 21.

The locally oscillating circuit is used to send a locally oscillating signal to a mixer. The mixer used in a receiver is operated at a high frequency, and typically requires a large operation current.

Then, a frequency converting apparatus for sending a current to a mixer based on a frequency signal used in the mixer is disclosed in, for example, Japanese Laid Open Utility Model Application (JPU-A-Showa 63-90316).

In the frequency converting apparatus, a high frequency signal and a locally oscillating signal are sent to a transistor of the mixer to be mixed with each other. The frequency converting apparatus has a matching coil to establish a matching among an input end of the mixer, an end for outputting the high frequency signal and an oscillating device for outputting the locally oscillating signal. Moreover, the frequency converting apparatus has a device for switching an operation current used in the transistor between a case of receiving a high frequency band signal and a case of receiving a low frequency band signal. The device has the function of smoothing a frequency characteristic of a conversion gain of the mixer.

However, a wireless selective call receiving apparatus of a direct conversion type needs a mixer to convert a high frequency signal onto a lower frequency signal. The mixer needs a large operation current to operate in the high frequency band. Thus, it is necessary to increase the operation current for the operation frequency to be set to be higher.

Even if the frequency converting apparatus mentioned-above is applied to the wireless selective call receiving apparatus, the frequency converting apparatus does not directly reduce the current consumption of the mixer. This is because the frequency converting apparatus is intended to smooth the frequency characteristic of the conversion gain.

In the wireless selective call receiving apparatus, direct conversion receiving method is effective in miniaturizing the circuit portion. In a normal super heterodyne manner, a band pass filter such as a ceramic filter is needed to process an IF (intermediate frequency) band signal. The size of the band pass filter is one of obstacles to the miniaturization.

On the contrary, a direct conversion receiving circuit processes a locally oscillating frequency signal equal to a carrier wave frequency of an input signal to directly convert a high frequency signal into a base band frequency signal. In this case, a filter to select a desirable signal may be a low pass filter. Thus, it is easy to integrate the direct conversion receiving circuit as an LSI. Therefore the receiving circuit can be miniaturized and the number of the parts can be reduced, in the direct conversion receiving circuit.

Now, the reason is explained why the operation current needed to operate the mixer is different depending on a processing frequency band (a carrier frequency band) and a larger operation current is required as the frequency of the processing signal is higher, in the direct conversion type wireless selective call receiving apparatus.

FIG. 1 is a block diagram showing a configuration of the direct conversion type receiving apparatus as an example of the wireless selective call receiving apparatus. In FIG. 1, a high frequency signal (a received signal) received at an antenna 501 is amplified by an amplifier 502 to be sent to a first mixer 503 and a second mixer 504.

A locally oscillating signal outputted by a local oscillator 505 is branched into two routes. One is directly sent to the first mixer 503 as a first locally oscillating signal. The other is inputted to a 90-degree phase shifter 506. The inputted signal is shifted in phase by 90degrees in the 90-degree phase shifter 506. The shifted signal is sent to the second mixer 504 as a second locally oscillating signal whose phase is shifted by 90 degrees with respect to the first locally oscillating signal.

A constant current source 515 is provided in the first mixer 503. A constant current is sent from the constant current source 515 to the first mixer 503. A constant current source 516 is provided in the second mixer 504. A constant current is sent from the constant current source 516 to the second mixer 504.

The first mixer 503 mixes the amplified high frequency signal with the first locally oscillating signal. The mixed signal is down-converted (converted the frequency thereof) to be outputted to a first low pass filter 507. The second mixer 504 mixes the amplified high frequency signal with the second locally oscillating signal. The mixed signal is down-converted to be outputted to a second low pass filter 508.

The first low pass filter 507 extracts only a base band signal from an output signal of the first mixer 503 to output an in-phase signal (I signal) to a demodulator. The second low pass filter 508 extracts only a base band signal from an output signal of the second mixer 504 to output a quadrature signal (Q signal) whose phase is different from the in-phase signal (I signal) by 90 degrees, to a demodulator 509.

The demodulator 509 demodulates the received signal based on the in-phase signal (I signal) and the quadrature signal (Q signal), which are respectively sent by the first low pass filter 507 and the second low pass filter 508. The demodulated signal is outputted to a control section 510. The control section 510 processes the signal demodulated by the demodulator 509 based on data such as the oscillation frequency of the local oscillator 105 and an ID address of the wireless selective call receiving apparatus stored in a read only memory 511.

The above mentioned direct conversion type wireless selective call receiving apparatus is typically used in a wide carrier frequency between a 150 MHz band and a 450 MHz band. A mixer is provided in an IC for a direct conversion. The operation current of the mixer is optimized based on the maximum usable carrier frequency in the mixer, for example, the 450 MHz band.

Thus, when the mixer is used at the carrier frequency of the 150 MHz band, the current exceeding the necessary value for being used at the 150 MHz band flows through the mixer. This results in the problem that the mixer current is not optimized.

SUMMARY OF THE INVENTION

The present invention is made to solve the above-described problems in the related arts as mentioned above.

The present invention is accomplished in order to solve the above mentioned problem. Therefore, an object of the present invention is to provide a wireless selective call receiving apparatus which can optimally perform an automatic control on an operation current of a mixer base on a carrier frequency and also reduce a consumption current.

In order to achieve an aspect of the present invention, a wireless selective call receiving apparatus includes a mixer section for converting a frequency of a received signal, a detecting section for detecting a carrier frequency when the received signal is received, and a control section for controlling a current sent to the mixer section based on a result detected by the detecting section.

In this case, the wireless selective call receiving apparatus includes a current supplying section, and wherein the control section controls the current supplying section such that when the carrier frequency is within a first range, the current of a first current value is sent to the mixer section, and when the carrier frequency is within a second range lower than the first range, the current of a second current value lower than the first current value is sent to the mixer section.

In this case, the wireless selective call receiving apparatus is a direct conversion type.

Also, in this case, the detecting section detects the carrier frequency by detecting a frequency division number of the carrier frequency.

Further, the detecting section may detect a predetermined carrier frequency band, including the carrier frequency.

In order to achieve another aspect of the present invention, the wireless selective call receiving apparatus further includes a plurality of constant current sources which are connected to the mixer section and have current values different from each other, and a switching section for selectively connecting one of the plurality of constant current sources to the mixer section, and wherein the control section controls the current sent to the mixer section by operating the switching section.

In this case, the wireless selective call receiving apparatus, further includes a memory for storing a table indicating a relation between the detected result and a value of the current sent to the mixer section, and wherein the control section determines the value of the current sent to the mixer section by referring to the table.

Also, in this case, wherein data indicative of a frequency division number of the carrier frequency is stored in the table as data corresponding to the detected result.

Further, in this case, data indicative of a frequency of the carrier frequency is stored in the table as data corresponding to the detected result.

In this case, data indicative of a height of the carrier frequency may be stored in the table as data corresponding to the detected result.

In order to achieve still another aspect of the present invention, a wireless selective call receiving apparatus includes a first mixer section for mixing a received high frequency signal with a locally oscillating signal outputted by a local oscillator to down-convert the high frequency signal, a phase shifter for shifting a phase of the locally oscillating signal to generate a phase oscillation signal, a second mixer section for mixing the phase oscillation signal with the high frequency signal to down-convert the high frequency signal, a first low pass filter for passing a base band signal from an output signal of the first mixer section to output as an in-phase signal, a second low pass filter for passing a base band signal from an output signal of the second mixer section to output as a phase signal whose phase is different from that of the in-phase signal, and a demodulator for demodulating the high frequency signal based on the in-phase signal and the phase signal, and wherein a first current and a second current corresponding to a carrier frequency when the high frequency signal is received, are sent to the first mixer section and the second mixer section respectively.

In this case, the phase shifter is a 90-degree phase shifter for shifting the phase of the locally oscillating signal by 90 degrees, and the phase signal is a quadrature signal whose phase is different from that of the in-phase signal by 90 degrees.

In order to achieve yet still another aspect of the present invention, a PLL (Phase-Locked Loop) synthesizer is used in the local oscillator, and the carrier frequency corresponds to a frequency division number of defining an oscillation frequency of the PLL synthesizer.

In order to achieve further still another aspect of the present invention, the first mixer, the second mixer, the phase shifter, the first low pass filter, the second low pass filter and the demodulator are integrated into a single chip.

In order to achieve another aspect of the present invention, a wireless selective call receiving method, includes the steps of providing a mixer section, converting a frequency of a received signal by the mixer section, detecting a carrier frequency when the received signal is received, and controlling a current sent to the mixer section based on the detected result.

In this case, a wireless selective call receiving method further includes a step of providing a current supplying section, and wherein the controlling step includes controlling the current supplying section such that when the carrier frequency is within a first range, the current of a first current value is sent to the mixer section, and when the carrier frequency is within a second range lower than the first range, the current of a second current value lower than the first current value is sent to the mixer section.

Also, in this case, the converting step includes converting the frequency by a direct conversion method.

Further, in this case, the detecting step includes detecting the carrier frequency by detecting a frequency division number of the carrier frequency.

In this case, the detecting step may include detecting a predetermined carrier frequency band, including the carrier frequency.

In order to achieve still another aspect of the present invention, a wireless selective call receiving method further includes the steps of providing a plurality of constant current sources which are connected to the mixer section and have current values different from each other, and providing a switching section for selectively connecting one of the plurality of constant current sources to the mixer section, and wherein the controlling step includes controlling the current sent to the mixer section by operating the switching section.

In order to achieve yet still another aspect of the present invention, a wireless selective call receiving method further includes the step of storing a table indicating a relation between the detected result and a value of the current sent to the mixer section, and wherein the controlling step includes determining the value of the current sent to the mixer section by referring to the table.

In order to achieve further still another aspect of the present invention, wherein the storing step includes storing data indicative of a frequency division number of the carrier frequency in the table as data corresponding to the detected result.

In this case, the storing step includes storing data indicative of a frequency of the carrier frequency in the table as data corresponding to the detected result.

Also, in this case, the storing step includes storing data indicative of a height of the carrier frequency in the table as data corresponding to the detected result.

BRIEF DESCRIPTION OF THE DRAWINGS

A more complete understanding of the teachings of the present invention may be acquired by referring to the accompanying figures, in which like reference numbers indicate like features and wherein:

FIG. 4 is a flowchart of describing operations of a second embodiment of the wireless selective call receiving apparatus in the present invention; and FIG. 5 is a flowchart of describing operations of a third embodiment of the wireless selective call receiving apparatus in the present invention.

DESCRIPTION OF THE PREFERRED EMBODIMENTS

Referring now to drawings, various preferred embodiments of the present invention will be described. Embodiments of the present invention will be described below with reference to the attached drawings. Embodiments of a wireless selective call receiving apparatus in the present invention will be described below with reference to the attached drawings.

Figure 1:
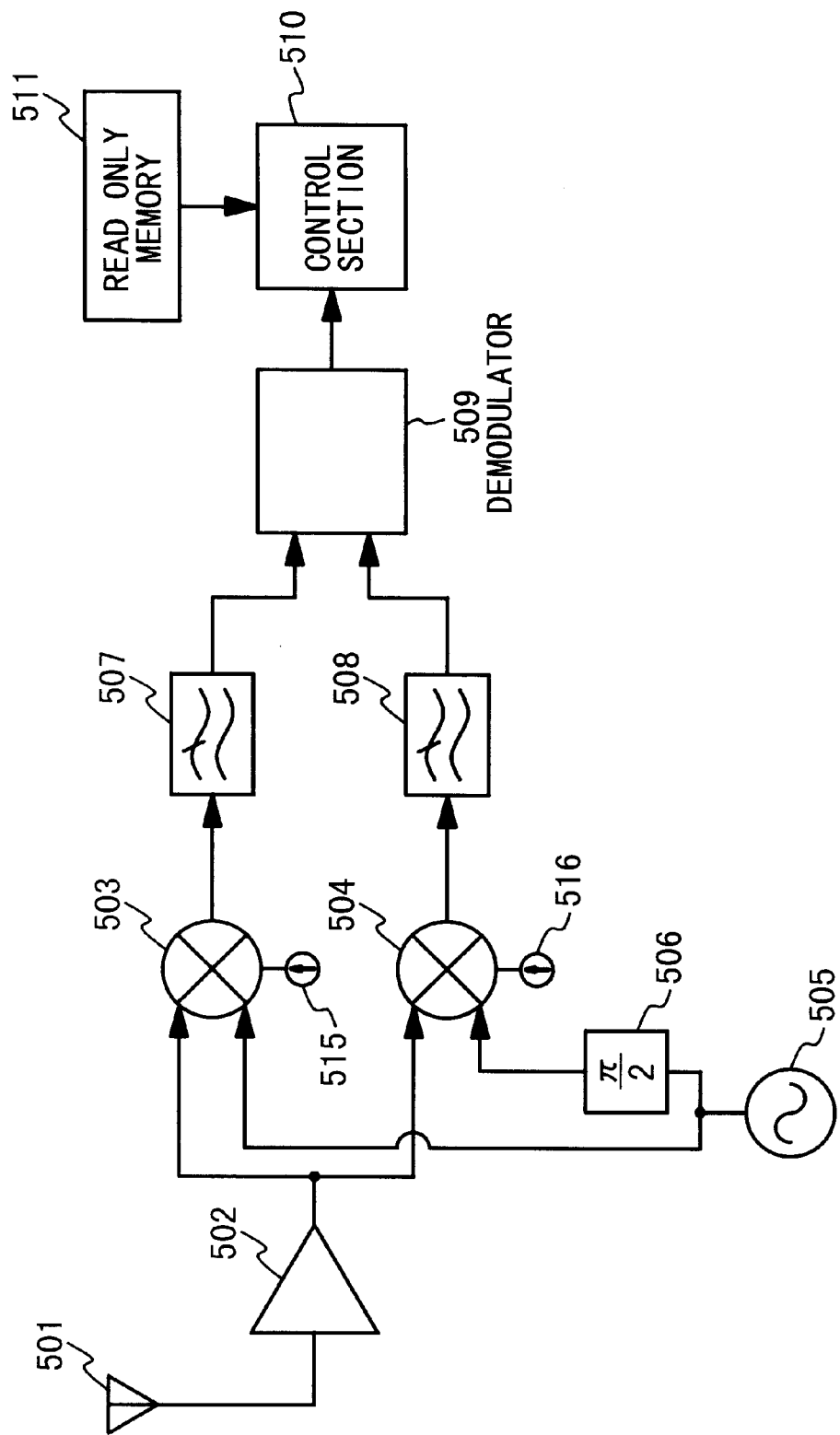
FIG. 1 is a block diagram showing a configuration of a conventional wireless selective call receiving apparatus.
Figure 2:
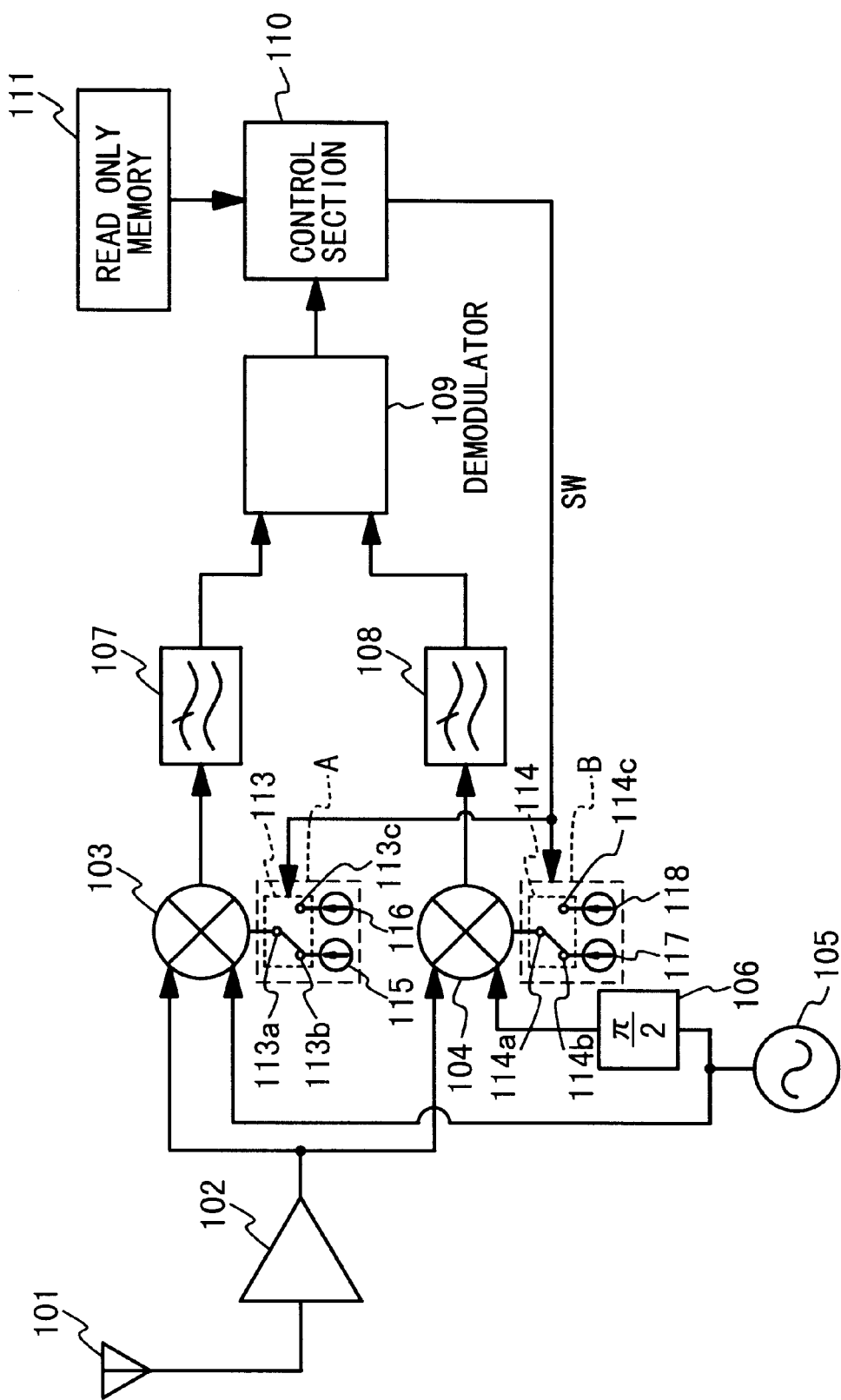
FIG. 2 is a block diagram showing a configuration of a first embodiment of the wireless selective call receiving apparatus in the present invention.

FIG. 2 is a block diagram showing a configuration of a first embodiment in the present invention.

The first embodiment shown in FIG. 2 shows a direct conversion type wireless selective call receiving apparatus. The direct conversion type is a type of directly converting a received high frequency signal into a base band signal without processing an intermediate frequency band signal. The direct conversion type apparatus can be constituted with an active filter for processing a low frequency band signal. Thus, the direct conversion type apparatus has the merit of easily being integrated as an IC (integrated into a single chip). Therefore, usually the portion including the mixer in the direct conversion type apparatus is integrated into the IC.

In the first embodiment, a first mixer 103, a second mixer 104, a 90-degree phase shifter 106, a first low pass filter 107, a second low pass filter 108, a demodulator 109, a control section 110 and a read only memory 111 are integrated into a single chip.

If a multiple-area service is performed, an automatic position registration can not be carried out. This is because the wireless selective call receiving apparatus does not comprise a transmitting function, unlike a portable telephone system.

Thus, it is necessary that a position registration is performed by a user. At first, the user performs an area registration if moving from a service area to another service area. In order to perform the area registration, the user inputs to a telephone unit a call number of a user's receiving apparatus, an identification number of it and a number of an area to which the user moves. Accordingly, the information of the area to which the user moves is stored in a home area center office.

After moving from the area, the user switches the area data of the receiving apparatus, and switches the receiving apparatus to be set in a wireless frequency and a wireless address used in the other area. As the result, the receiving apparatus can be used in the other area.

When an originator performs a call with a telephone, the call is connected to a home area center office of a receiving apparatus called by the call in response to the call. Then, the home area center office transfers a signal to a sub area center office on which the called receiving apparatus is presently registered. As the result, the call can be performed in the sub area.

In this case, if all the service areas to be used are located away from each other, it is possible to utilize the same wireless channel. However, interference is generated when the same wireless channel is the utilized in the service areas adjacent to each other. Thus, the same wireless channel can not be utilized. For this reason, the receiving apparatus for the multiplearea service employs a synthesizer type which can switch the wireless channel.

As shown in FIG. 2, a received signal (high frequency signal) received through an antenna 101 is inputted to an amplifier 102. The high frequency signal amplified by the amplifier 102 is outputted to both the first mixer 103 and the second mixer 104.

A locally oscillating signal outputted by the local oscillator 105 is branched into two routes. This first embodiment is explained under the assumption that the PLL synthesizer is used as the local oscillator 105. One of the locally oscillating signal is inputted to the first mixer 103, and the other is inputted to the 90-degree phase shifter 106.

The 90-degree phase shifter 106 shifts the phase of the locally oscillating signal by 90 degrees to output to the second mixer 104. Thus, the phase of the locally oscillating signal inputted to the first mixer 103 is different from the one of the locally oscillating signal inputted to the second mixer 104 by 90 degrees.

A first constant current supplying device "A" is provided in the first mixer 103. A second constant current supplying device "B" is provided in the second mixer 104. The first constant current supplying device "A" includes a switch 113 and constant current sources 115 and 116. The switch 113 has a movable terminal 113a and two fixed terminals 113b, 113c. The movable terminal 113a is connected to the first mixer 103. The fixed terminals 113b, 113c are connected to the constant current sources 115, 116, respectively.

The movable terminal 113a of the switch 113 is switched to be connected to the first mixer 103 by selecting any one of the constant current sources 115 and 116. The movable terminal 113a of the switch 113 is switched in response to a control signal outputted from the control section 110.

In this first embodiment, both the 150 MHz band and the 300 MHz band can be used as the carrier frequency. If the 150 MHz band is used as the carrier frequency, the constant current source 115 is selected as the optimal current source for the low frequency band. When the 300 MHz band is used as the carrier frequency, the constant current source 116 is selected as the optimal current source for the high frequency band.

Thus, when the low frequency is used for the carrier frequency, the movable terminal 113a of the switch 113 is switched to the side of the fixed terminal 113b by the control section 110. As the result, the constant current source 115 of which the outputted current is set to a lower value is selected.

When the high frequency is used for the carrier frequency, the movable terminal 113a of the switch 113 is switched to the side of the fixed terminal 113c by the control section 110 for the operation frequency of the first mixer 103 to be higher. As the result, the constant current source 116 of which the outputted current is set to a higher value is selected.

Similarly, the second constant current supplying device "B" includes a switch 114 and constant current sources 117 and 118. The switch 114 has a movable terminal 114a and two fixed terminals 114b, 114c. The movable terminal 114a is connected to the second mixer 104. The fixed terminals 114b, 114c are connected to the constant current sources 117, 118, respectively.

The movable terminal 114a of the switch 114 is switched to be connected to the second mixer 104 by selecting any one of the constant current sources 117 and 118. The movable terminal 114a of the switch 114 is switched in response to a control signal outputted from the control section 110.

Also in this case, if the low frequency (the 150 MHz band) is used as the carrier frequency, the movable terminal 114a of the switch 114 is switched to the side of the fixed terminal 114b by the control of the control section 110. As the result, the constant current source 117 of which the outputted current is set to a lower value is selected.

When the high frequency (the 300 MHz band) is used for the carrier frequency, the movable terminal 114a of the switch 114 is switched to the side of the fixed terminal 114c by the control section 110 for the operation frequency of the second mixer 104 to be higher. As the result, the constant current source 118 of which the outputted current is set to a higher value is selected.

The output signal of the first mixer 103 is sent to the first low pass filter 107. The output signal of the second mixer 104 is sent to the second low pass filter 108.

The first low pass filter 107 is a low pass filter for extracting an in-phase signal (I signal) from the output signal of the first mixer 103. The second low pass filter 108 is a low pass filter for extracting a quadrature signal (Q signal) from the output signal of the second mixer 104.

The in-phase signal (I signal) extracted by the first low pass filter 107 and the quadrature signal (Q signal) extracted by the second low pass filter 108 are both outputted to the demodulator 109.

The demodulator 109 demodulates the received signal based on both the inputted in-phase signal (I signal) and the inputted quadrature signal (Q signal). The signal demodulated by the demodulator 109 is outputted to the control section 110.

The control section 110 processes the demodulated signal, and then reads out the carrier frequency information which is stored in advance in the read only memory (ROM) 111 serving as a storing device. The control section 110 further generates the control signal to control the switch 113 and the switch 114.

In this first embodiment, the case of the utilization in the low frequency band of the 150 MHz band and the high frequency band of the 300 MHz band is explained as the example as mentioned above. Thus, the above mentioned 150 MHz and 300 MHz are stored as the carrier frequency information stored in the read only memory 111.

Now, it is assumed that the carrier frequency of the 150 MHz band is within a range between 100 MHz and 200 MHz, the carrier frequency of the 300 MHz band is within a range between 250 MHz and 350 MHz, and a channel interval is 25 KHz.

Since the PLL synthesizer is used as the local oscillator 105, the frequency division number data is stored in the read only memory 111, in addition to the ID address of the wireless selective call receiving apparatus.

The control section 110 reads out the carrier frequency information from the read only memory 111 to generate the control signal for switching the switch 113 and the switch 114, respectively.

The operations of the first embodiment having the above mentioned configuration will be described below with reference to a flowchart in FIG. 3.

Figure 3:
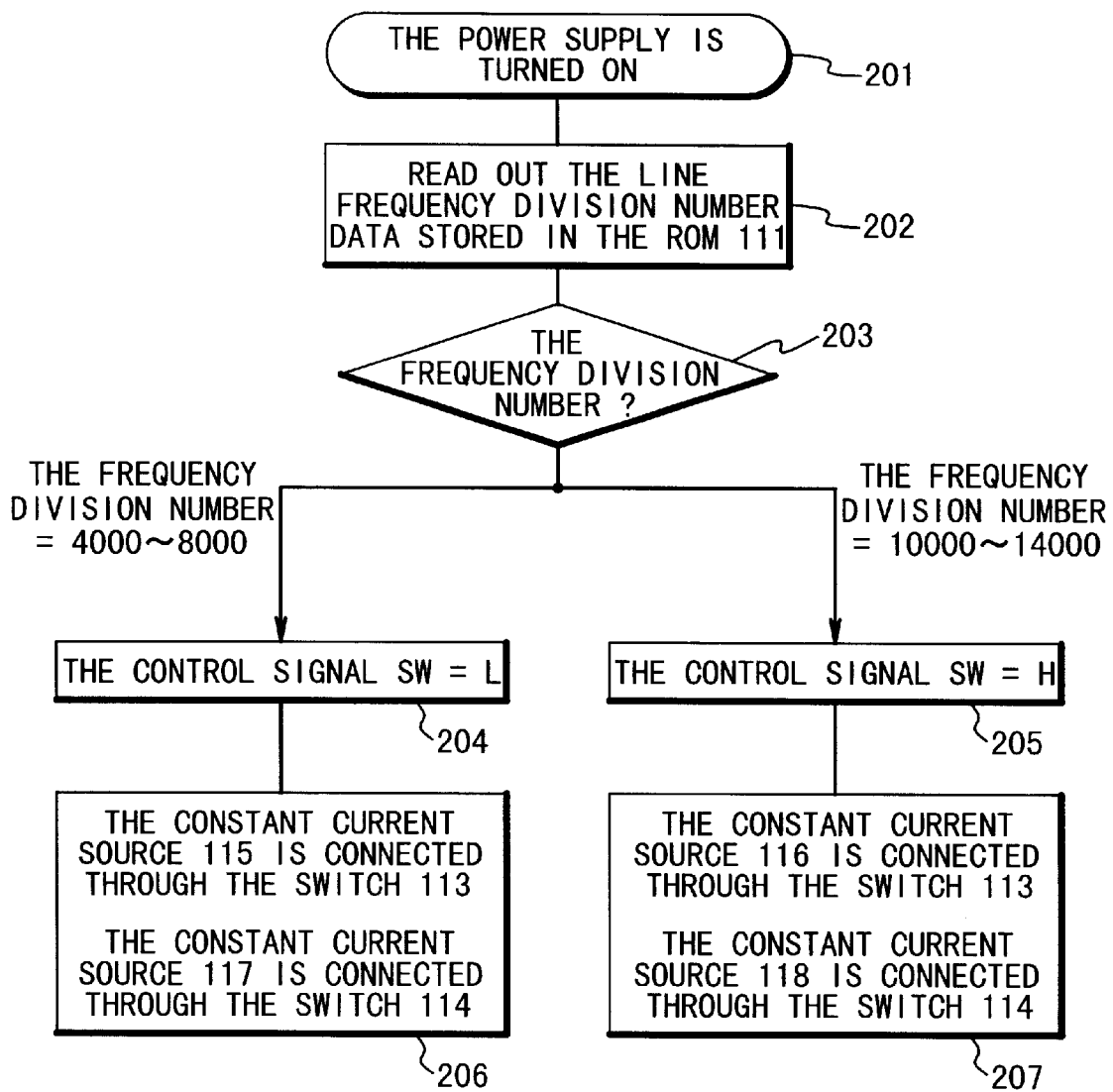
FIG. 3 is a flowchart of describing operations of the first embodiment of the wireless selective call receiving apparatus in the present invention.

At first, in the flowchart in FIG. 3, the power supply (not shown) of the wireless selective call receiving apparatus is turned on at a step 201. At a step 202, the control section 110 reads out the frequency division number data from the carrier frequency information stored in the read only memory 111 to check it.

The carrier frequency of the 150 MHz band is within a range between 100 MHz and 200 MHz. The channel interval is 25 KHz. The frequency division number of the carrier frequency of the 150 MHz band is within a range between 4000 and 8000. The carrier frequency of the 300 MHz band is within a range between 250 MHz and 350 MHz. The frequency division number of the 300 MHz band is within a range between 10000 and 14000.

Thus, the control section 110 can judge the frequency band of the received signal received in the antenna 101 based on the frequency division number data of the carrier frequency.

When the control section 110 judges at a step 203 that the frequency division number of the carrier frequency is within the range between 4000 and 8000, the control section 110 advances the process from the step 203 to a step 204. And the control section 110 outputs, for example, a signal corresponding to a low level (L) as the control signal SW at a step 204. Further, the control section 110 switches the movable terminal 113a of the switch 113 of the first constant current supplying device "A" to the side of the fixed terminal 113b at a step 206.

Accordingly, the constant current source 115 is connected through the switch 113 to the first mixer 103 as the constant current source. At the same time, the movable terminal 114a of the switch 114 of the second constant current supplying device "B" is switched to the side of the fixed terminal 114b by the control section 110 to select the constant current source 117. Thereby, the constant current source 117 is connected to the second mixer 104.

On the other hand, when the control section 110 judges at the step 203 that the frequency division number is within the range between 10000 and 14000, the control section 110 advances the process from the step 203 to a step 205. And the control section 110 outputs, for example, a signal corresponding to a high level (H) as the control signal SW at step 205. Further the control section 110 switches the movable terminal 113a of the switch 113 of the first constant current supplying device "A" to the side of the fixed terminal 113c at a step 207.

Accordingly, the constant current source 116 is connected through the switch 113 to the first mixer 103 as the constant current source. At the same time, the movable terminal 114a of the switch 114 of the second constant current supplying device "B" is switched to the side of the fixed terminal 114c by the control section 110 to select the constant current source 118. Thereby, the constant current source 118 is connected to the second mixer 104.

As mentioned above, in the first embodiment, the carrier frequency information is stored in the read only memory 111. If the control section 110 judges that the carrier frequency is low based on the carrier frequency information, the constant current from the constant current source 115 of which the outputted current is set to the low value is sent to the first mixer 103. In this case, further the constant current from the constant current source 117 of which the outputted current is set to the low value is also sent to the second mixer 104.

On the other hand, if the control section 110 judges that the carrier frequency is high, the constant current from the constant current source 116 of which the outputted current is set to the high value is sent to the first mixer 103, and similarly the constant current from the constant current source 118 of which the outputted current is set to the high value is also sent to the second mixer 104. Hence, it is possible to automatically optimize the operation currents needed to operate the first mixer 103 and the second mixer 104 respectively based on the carrier frequency.

A high frequency signal (received signal) received in the antenna 101 is amplified by the amplifier 102 to be sent to the first mixer 103 and the second mixer 104. The locally oscillating signal outputted by the local oscillator 105 is branched into two routes. One is directly sent to the first mixer 103 as a first locally oscillating signal. The other is inputted to the 90-degree phase shifter 106 and is shifted in phase by 90 degrees in the 90-degree phase shifter 106. The shifted in phase signal is sent to the second mixer 104 as a second locally oscillating signal whose phase is shifted by 90 degrees with respect to the first locally oscillating signal.

The constant current is sent to the first mixer 103 from any one of the two constant current sources 115, 116 whose supplying current values are different from each other, based on the above mentioned operations. Similarly, the constant current is sent to the second mixer 104 from any one of the two constant current sources 117, 118 whose supplying current values are different from each other, based on the above mentioned operations.

The first mixer 103 mixes the high frequency signal with the first locally oscillating signal to down-convert. The first mixer 103 outputs the down-converted signal to the first low pass filter 107. Similarly, the second mixer 104 mixes the high frequency signal with the second locally oscillating signal whose phase is shifted by 90 degrees with respect to the first locally oscillating signal to down-convert. The second mixer 104 outputs the down-converted signal to the second low pass filter 108.

The first low pass filter 107 extracts only the base band signal from the output signal of the first mixer 103 to output the in-phase signal (I signal) to the demodulator 109. The second low pass filter 108 extracts only the base band signal from the output signal of the second mixer 104 to output the quadrature signal (Q signal) whose phase is different from the in-phase signal (I signal) by 90 degrees, to the demodulator 109.

The demodulator 109 demodulates the received signal based on the in-phase signal and the quadrature signal which are respectively obtained by the first low pass filter 107 and the second low pass filter 108 to output to the control section 110.

The control section 110 processes the received signal demodulated by the demodulator 109 based on the data such as the oscillation frequency of the local oscillator 105 and the ID address of the wireless selective call receiving apparatus stored in the read only memory 511.

According to this first embodiment, when the received signal is received, the control section 110 reads the carrier frequency information stored in the read only memory 111 to generate the control signal SW corresponding to the carrier frequency band of the received signal. The control signal SW is inputted to the first constant current supplying device "A" and the second constant current supplying device "B", respectively. The first constant current supplying device "A" and the second constant current supplying device "B" perform the switching controls based on the control signal SW, respectively. As the result, the optimal constant current is sent to the first mixer 103 and the second mixer 104, respectively.

In this state, the received high frequency signal is inputted to the first mixer 103 and the second mixer 104. The first mixer 103 mixes the received high frequency signal with the locally oscillating signal outputted by the local oscillator 105 to down-convert. The first mixer 103 outputs the down-converted signal to the first low pass filter 107. The first low pass filter 107 extracts the in-phase signal to output to the demodulator 109.

The locally oscillating signal outputted by the local oscillator 105 is shifted in phase by 90 degrees by the 90-degree phase shifter 106. The shifted in phase signal is outputted to the second mixer 104. The second mixer 104 mixes the received high frequency signal with the locally oscillating signal whose phase is shifted by 90 degrees to down-convert and output the down-converted signal to the second low pass filter 108. The second low pass filter 108 extracts the quadrature signal whose phase is different from the in-phase signal by 90 degrees, to the demodulator 109.

The demodulator 109 demodulates the received signal based on the in-phase signal and the quadrature signal to output to the control section 110. The control section 110 processes the demodulated signal outputted from the demodulator 109.

A second embodiment in the present invention will be described below.

In this second embodiment, for example, the dedicated carrier frequency data corresponding to the channel of the wireless selective call receiving apparatus is stored in the read only memory 111 as the carrier frequency information. That is to say, when the wireless selective call receiving apparatus is shipped, the dedicated carrier frequency data is stored in the read only memory 111 as in the case of the ID address of the wireless selective call receiving apparatus and the like being stored.

Operations in this case will be described below with reference to a flowchart in FIG. 4.

In FIG. 4, when the power supply is firstly turned on at a step 301, at a step 302 the control section 110 reads out the carrier frequency data stored in the read only memory 111 and checks it. If judging at a step 303 that the read out carrier frequency is within a range between 100 MHz and 200 MHz, the control section 110 advances the process from the step 303 to a step 304, and then outputs a signal corresponding to the low level as the control signal SW.

In response to the control signal SW corresponding to the low level, the movable terminal 113a of the switch 113 of the first constant current supplying device "A" is switched to the side of the fixed terminal 113b at a step 306. As the result, the constant current source 115 is connected through the switch 113 to the first mixer 103. The constant current is sent to this first mixer 103 from the constant current source 115.

At the same time, the movable terminal 114a of the switch 114 of the second constant current supplying device "B" is switched to the side of the fixed terminal 114b. As the result, the constant current source 117 is connected to the second mixer 104, and the constant current from the constant current source 117 is sent to this second mixer 104.

If at the step 303 the control section 110 judges that the read out carrier frequency is within a range between 250 MHz and 350 MHz, it advances the process from the step 303 to a step 305. Then the control section 110 outputs a signal corresponding to the high level as the control signal SW.

In response to the signal SW corresponding to the high level, the movable terminal 113a of the switch 113 of the first constant current supplying device "A" is switched to the side of the fixed terminal 113c at a step 307. Also, in response to the signal SW corresponding to the high level, the movable terminal 114a of the switch 114 of the second constant current supplying device "B" is switched to the side of the fixed terminal 114c.

As the result, the constant current from the constant current source 116 is sent to the first mixer 103, and the constant current from the constant current source 118 is sent to the second mixer 104.

Hence, also in this second embodiment, it is possible to automatically optimize the operation currents needed to operate the first mixer 103 and the second mixer 104 respectively based on the carrier frequency stored in the read only memory 111.

A third embodiment in the present invention will be described below.

The third embodiment has a configuration described below. For example, as the frequency band data, data of [0] is stored in the read only memory 111 in the case of the 150 MHz band, and data of [1] is stored in the read only memory 111 in the case of the 300 MHz band. The control section 110 reads out the stored data to perform the switching control between the respective constant current sources 115, 116 and 117, 118 of the first constant current supplying device A and the second constant current supplying device B.

Operations in this third embodiment will be described below with reference to a flowchart in FIG. 5.

At first, the power supply of the wireless selective call receiving apparatus is turned on at a step 401. The control section 110 reads out the frequency data stored in the read only memory 111 to output as the control signal SW at the step 402.

If this frequency data is [0], the control section 110 outputs, for example, the control signal SW corresponding to the low level at the step 403. If the frequency data is [1], the control section 110 outputs the control signal SW corresponding to the high level.

If the control signal SW is at the low level, the movable terminal 113a of the switch 113 of the first constant current supplying device "A" is switched to the side of the fixed terminal 113b at a step 404. The constant current source 115 is selected. This constant current source 115 is connected to the first mixer 103. Then, the constant current from the constant current source 115 is automatically sent to the first mixer 103 as the optimal operation current for the 150 MHz band.

At the same time, the movable terminal 114a of the switch 114 of the second constant current supplying device "B" is switched to the side of the fixed terminal 114b. The constant current source 117 is connected to the second mixer 104. Then, the constant current from the constant current source 117 is automatically sent to the second mixer 104 as the optimal operation current for the 150 MHz band.

Moreover, at the step 403, if the frequency data is [1], the control section 110 outputs the control signal SW corresponding to the high level. The movable terminal 113a of the switch 113 of the first constant current supplying device "A" is switched to the side of the fixed terminal 113c at a step 405. The constant current source 116 is selected. This constant current source 116 is connected to the first mixer 103. Then, the constant current from the constant current source 116 is automatically sent to the first mixer 103 as the optimal operation current for the 300 MHz band.

At the same time, the movable terminal 114a of the switch 114 of the second constant current supplying device "B" is switched to the side of the fixed terminal 114c. The constant current source 118 is connected to the second mixer 104. Then, the constant current from the constant current source 118 is automatically sent to the second mixer 104 as the optimal operation current for the 300 MHz band.

Incidentally, in the respective embodiments, the case is described in which the carrier frequency is divided into the two frequency bands and then the two constant current sources corresponding to the respective frequency bands are provided. However, in the present invention, there is no limit on the manner of dividing the carrier frequency and on the number of the constant current sources.

As mentioned above, according to the present invention, the constant current source set to the predetermined current value based on the carrier frequency information stored in the memory is selected by the control section. Accordingly, the optimal operation current is sent to the first mixer and the second mixer. Therefore, it is possible to reduce the current consumption and also possible to automatically send the optimal operation current to the first mixer and the second mixer.

What is claimed is:

1. A wireless selective call receiving apparatus for performing an optimal control on an operation current of a mixer based on a carrier frequency, comprising:

a mixer section for converting a frequency of a received signal to a base band signal without processing an intermediate frequency conversion;

a detecting section for detecting a carrier frequency when said received signal is received;

a control section for controlling a current sent to said mixer;

a plurality of constant current sources which are connected to said mixer section and have current values different from each other; and a switching section for selectively connecting one of said plurality of constant current sources to said mixer section, and wherein said control section controls said current sent to said mixer section by operating said switching section.

2. A wireless selective call receiving apparatus according to claim 1, further comprising a current supplying section, and wherein said control section controls said current supplying section such that when said carrier frequency is within a first range, said current of a first current value is sent to said mixer section, and when said carrier frequency is within a second range lower than said first range, said current of a second current value lower than said first current value is sent to said mixer section.

3. A wireless selective call receiving apparatus according to claim 1, wherein said wireless selective call receiving apparatus is a direct conversion type.

4. A wireless selective call receiving apparatus according to claim 1, wherein said detecting section detects said carrier frequency by detecting a frequency division number of said carrier frequency.

5. A wireless selective call receiving apparatus according to claim 1, wherein said detecting section detects a predetermined carrier frequency band, including said carrier frequency.

6. A wireless selective call receiving apparatus according to claim 1, further comprising:

a memory for storing a table indicating a relation between said detected result and a value of said current sent to said mixer section, and wherein said control section determines said value of said current sent to said mixer section by referring to said table.

7. A wireless selective call receiving apparatus according to claim 6, wherein data indicative of a frequency division number of said carrier frequency is stored in said table as data corresponding to said detected result.

8. A wireless selective call receiving apparatus according to claim 6, wherein data indicative of a frequency of said carrier frequency is stored in said table as data corresponding to said detected result.

9. A wireless selective call receiving apparatus according to claim 6, wherein data indicative of a height of said carrier frequency is stored in said table as data corresponding to said detected result.

10. A wireless selective call receiving apparatus for performing an optimal control on an operation current of a mixer based on a carrier frequency, comprising:

a first mixer section for mixing a received high frequency signal with a locally oscillating signal outputted by a local oscillator to down-convert said high frequency signal to said base band signal without processing an intermediate frequency conversion;

a phase shifter for shifting a phase of said locally oscillating signal to generate a phase oscillation signal;

a second mixer section for mixing said high frequency signal with said phase oscillation signal to down-convert said high frequency signal to said base band signal without processing a intermediate frequency conversion;

a first low pass filter for passing a base band signal from an output signal of said first mixer section to output as an in-phase signal;

a second low pass filter for passing a base band signal from an output signal of said second mixer section to output as a phase signal whose phase is different from that of said in-phase signal; and a demodulator for demodulating said high frequency signal based on said in-phase signal and said phase signal, and wherein a first current and a second current corresponding to said carrier frequency, when said high frequency signal is received, are sent to said first mixer section and said second mixer section respectively.

11. A wireless selective call receiving apparatus according to claim 10, wherein said phase shifter is a 90-degree phase shifter for shifting said phase of said locally oscillating signal by 90 degrees, and said phase signal is a quadrature signal whose phase is different from that of said in-phase signal by 90 degrees.

12. A wireless selective call receiving apparatus according to claim 10, wherein a PLL (Phase-Locked Loop) synthesizer is used in said local oscillator, and said carrier frequency corresponds to a frequency division number of defining an oscillation frequency of said PLL synthesizer.

13. A wireless selective call receiving apparatus according to claim 10, wherein said first mixer, said second mixer, said phase shifter, said first low pass filter, said second low pass filter and said demodulator are integrated into a single chip.

14. A wireless selective call receiving method for performing an optimal control on an operation current of a mixer based on a carrier frequency, comprising the steps of:

providing a mixer section;

converting a frequency of a received signal to a base band signal without processing an intermediate frequency conversion by said mixer section;

detecting said carrier frequency when said received signal is received; and controlling a current sent to said mixer section;

providing a plurality of constant current sources which are connected to said mixer section and have current values different from each other; and providing a switching section for selectively connecting one of said plurality of constant current sources to said mixer section, and wherein said controlling step includes controlling said current sent to said mixer section by operating said switching section.

15. A wireless selective call receiving method according to claim 14, further comprising a step of:

providing a current supplying section, and wherein said controlling step includes controlling said current supplying section such that when said carrier frequency is within a first range, said current of a first current value is sent to said mixer section, and when said carrier frequency is within a second range lower than said first range, said current of a second current value lower than said first current value is sent to said mixer section.

16. A wireless selective call receiving method according to claim 14, wherein said converting step includes converting said frequency by a direct conversion method.

17. A wireless selective call receiving method according to claim 14, wherein said detecting step includes detecting said carrier frequency by detecting a frequency division number of said carrier frequency.

18. A wireless selective call receiving method according to claim 14, wherein said detecting step includes detecting a predetermined carrier frequency band, including said carrier frequency.

19. A wireless selective call receiving method according to claim 14, further comprising the step of:

storing a table indicating a relation between said detected result and a value of said current sent to said mixer section, and wherein said controlling step includes determining said value of said current sent to said mixer section by referring to said table.

20. A wireless selective call receiving method according to claim 19, wherein said storing step includes storing data indicative of a frequency division number of said carrier frequency in said table as data corresponding to said detected result.

21. A wireless selective call receiving method according to claim 19, wherein said storing step includes storing data indicative of a frequency of said carrier frequency in said table as data corresponding to said detected result.

22. A wireless selective call receiving method according to claim 19, wherein said storing step includes storing data indicative of a height of said carrier frequency in said table as data corresponding to said detected result.

* * * * *